United States Patent
Feng et al.

(10) Patent No.: US 11,011,575 B2
(45) Date of Patent: May 18, 2021

(54) CIRCUIT SELECTOR OF EMBEDDED MAGNETORESISTIVE RANDOM ACCESS MEMORY

(71) Applicant: UNITED MICROELECTRONICS CORP., Hsin-Chu (TW)

(72) Inventors: Ya-Sheng Feng, Tainan (TW); Yu-Chun Chen, Kaohsiung (TW); Chiu-Jung Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/655,251

(22) Filed: Oct. 17, 2019

(65) Prior Publication Data
US 2021/0083002 A1   Mar. 18, 2021

(30) Foreign Application Priority Data
Sep. 18, 2019   (CN) .......................... 201910881023.0

(51) Int. Cl.
| H01L 27/22 | (2006.01) |
| G11C 11/16 | (2006.01) |
| H01L 43/10 | (2006.01) |
| H01F 10/32 | (2006.01) |
| H01L 43/02 | (2006.01) |

(52) U.S. Cl.
CPC .......... *H01L 27/228* (2013.01); *G11C 11/161* (2013.01); *H01F 10/3254* (2013.01); *H01L 43/02* (2013.01); *H01L 43/10* (2013.01)

(58) Field of Classification Search
CPC ...... H01L 27/228; H01L 43/02; G11C 11/161
See application file for complete search history.

(56) References Cited

U.S. PATENT DOCUMENTS

| 9,548,096 B1 | 1/2017 | Li et al. |
| 2010/0118589 A1 | 5/2010 | Carter et al. |
| 2015/0357376 A1* | 12/2015 | Seo ..................... G11C 11/1655 257/252 |

\* cited by examiner

*Primary Examiner* — Jose R Diaz
(74) *Attorney, Agent, or Firm* — Winston Hsu

(57) ABSTRACT

A circuit selector of embedded magnetoresistive random access memory (EMRAM) includes a transistor comprising a source/drain terminal coupled to a first magnetic tunneling junction (MTJ) and a second MTJ, a gate terminal, and a drain/source terminal coupled to a voltage source. Preferably, the first MTJ includes a first free layer, a first barrier layer, and a first pinned layer, in which the first free layer is coupled to the source/drain terminal and the first pinned layer is coupled to a first circuit. The second MTJ includes a second free layer, a second barrier layer, and a second pinned layer, in which the second pinned layer is coupled to the source/drain terminal and the second free layer is coupled to a second circuit.

5 Claims, 3 Drawing Sheets

CIRCUIT SELECTOR OF EMBEDDED MAGNETORESISTIVE RANDOM ACCESS MEMORY

BACKGROUND OF THE INVENTION

1. Field of the Invention

The invention relates to a magnetoresistive random access memory (MRAM), and more particularly to a circuit selector of a MRAM.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a circuit selector of embedded magnetoresistive random access memory (EMRAM) includes a transistor comprising a source/drain terminal coupled to a first magnetic tunneling junction (MTJ) and a second MTJ, a gate terminal, and a drain/source terminal coupled to a voltage source.

According to an embodiment of the present invention, the first MTJ includes a first free layer, a first barrier layer, and a first pinned layer, in which the first free layer is coupled to the source/drain terminal and the first pinned layer is coupled to a first circuit.

According to an embodiment of the present invention, the second MTJ includes a second free layer, a second barrier layer, and a second pinned layer, in which the second pinned layer is coupled to the source/drain terminal and the second free layer is coupled to a second circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
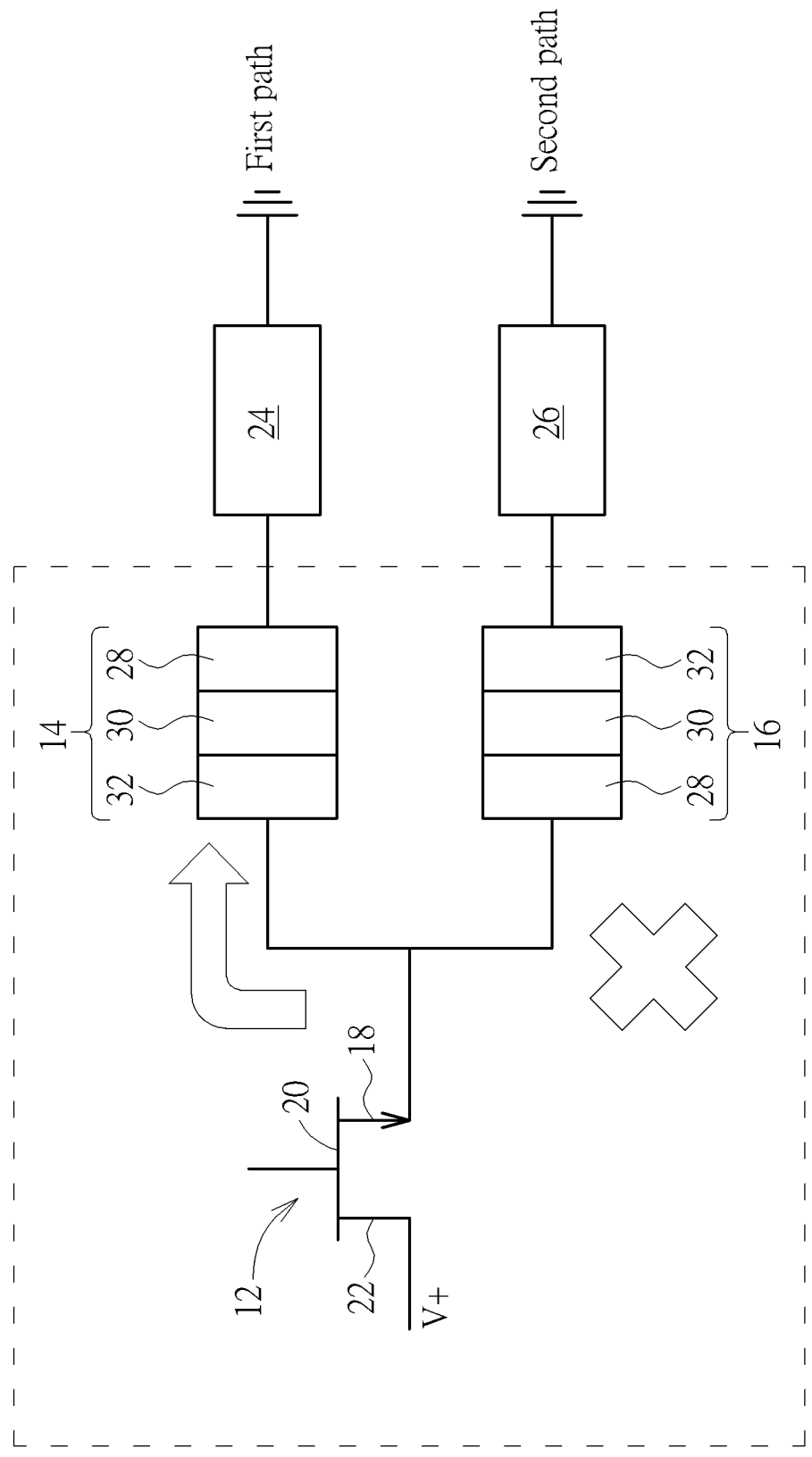
FIG. 1 illustrates a circuit diagram of a circuit selector of embedded MRAM according an embodiment of the present invention.
Figure 2:
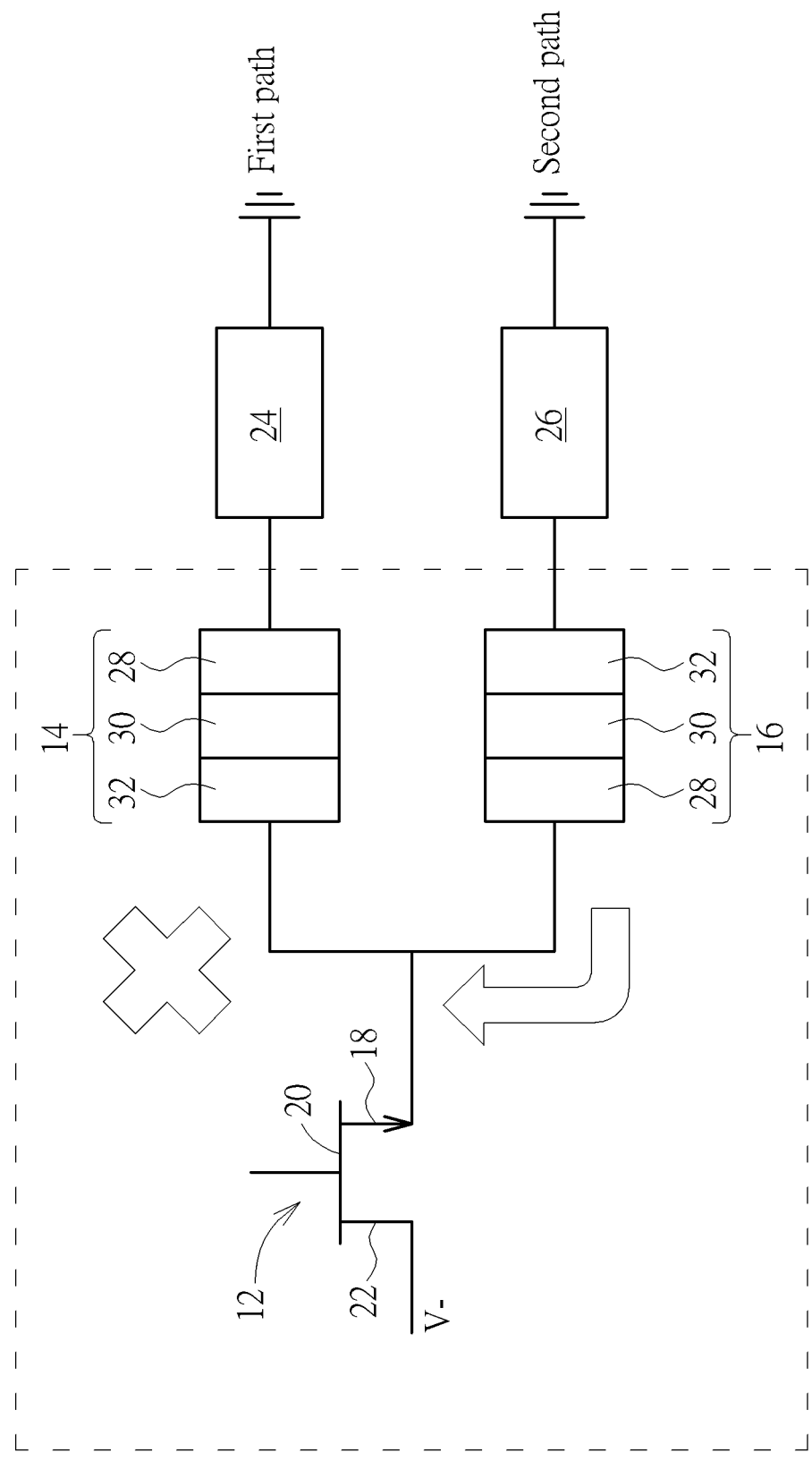
FIG. 2 illustrates a circuit diagram of a circuit selector of embedded MRAM according to an embodiment of the present invention.

Referring to FIGS. 1-2, FIGS. 1-2 illustrate circuit diagrams of a circuit selector of embedded MRAM according to different embodiments of the present invention. As shown in FIG. 1, the circuit selector preferably includes a transistor 12, a first MTJ 12, and a second MTJ 16, in which the transistor 12 includes a source/drain terminal 18, a gate terminal 20, and a drain/source terminal 22.

In this embodiment, the first MTJ 14 is preferably a standard cell while the second MTJ 16 is a reverse cell, in which one end of the first MTJ 14 and one end of the second MTJ 16 are coupled to the source/drain terminal 18 of the transistor 12 at the same time, another end of the first MTJ 14 is coupled to a first circuit 24 through a first path, and another end of the second MTJ 16 is coupled to a second circuit 26 through a second path. Preferably, one end of the first circuit 24 is coupled to the first MTJ 14 and another end of the first circuit 24 is coupled to ground. Similarly, one end of the second circuit 26 is coupled to the second MTJ 16 and another end of the second circuit 26 is coupled to ground.

In this embodiment, each of the first MTJ 14 and the second MTJ 16 could include a bottom electrode (not shown), a pinned layer 28, a barrier layer 30, a free layer 32, a capping layer (not shown), and a top electrode (not shown). Preferably, the top electrode layer and the bottom electrode are preferably made of conductive material including but not limited to for example Ta, Pt, Cu, Au, Al, or combination thereof. The pinned layer 28 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 28 is formed to fix or limit the direction of magnetic moment of adjacent layers. The barrier layer 30 could include material such as MgO, AlN, AlON, other non-magnetic material, or even dielectric material. The free layer 32 could be made of ferromagnetic material including but not limited to for example iron, cobalt, nickel, or alloys thereof such as cobalt-iron-boron (CoFeB), in which the magnetized direction of the free layer 32 could be altered freely depending on the influence of outside magnetic field. The capping layer could be made of insulating material including but not limited to for example oxides such as aluminum oxide ($AlO_x$) or magnesium oxide (MgO).

It should be noted that the source/drain terminal 18 of the transistor 12 is directly connected or coupled to the free layer 32 (or free layer end) of the first MTJ 14 and the pinned layer 28 (or pinned layer end) of the second MTJ 16 at the same time, the pinned layer 28 (or pinned layer end) of the first MTJ 14 is coupled to the first circuit 24, and the free layer 32 (or free layer end) of the second MTJ 16 is coupled to the second circuit 26. Specifically, the circuit selector of this embodiment connects two MTJs to a source/drain terminal 18 of the transistor 12 at the same time through parallel connection while each of the MTJs also connects a circuit separately through independent paths, in which one path is open when another path is closed.

Typically, memory cells including standard cells and reverse cells within conventional embedded MRAM are connected separately and independently, resulting in poor performance and large occupancy of space. To improve performance and consumption efficiency of space in embedded MRAM, the circuit selector of the present invention preferably connects two types of memory cells including for example standard cell and reverse cells at the same time according to different modes of operation. For instance, as shown in FIG. 1, when the drain/source terminal 22 of the transistor 12 provides a positive voltage V+, electrical current then flows toward the first MTJ 14 according to the direction of the arrow. After being filtered by the first MTJ 14, the first MTJ 14 becomes a low resistance state while the second MTJ 16 becomes a high resistance state. In the meantime the first circuit 24 coupled to the pinned layer 28 end of the first MTJ 14 is turned on along the first path while the second circuit 26 coupled to the free layer 32 end of the second MTJ 16 is turned off.

Conversely, as shown in FIG. 2, when the drain/source terminal 22 provides a negative voltage V−, electrical current then travels toward the second MTJ 16 along the direction of the arrow so that the second MTJ 16 is at low resistance state while the first MTJ 14 is at high resistance state. In the meantime the second circuit 26 coupled to the free layer 32 end of the second MTJ 16 is then turned on according to the second path while the first circuit 24 coupled to the pinned layer 28 end of the first MTJ 14 is turned off.

Figure 3:
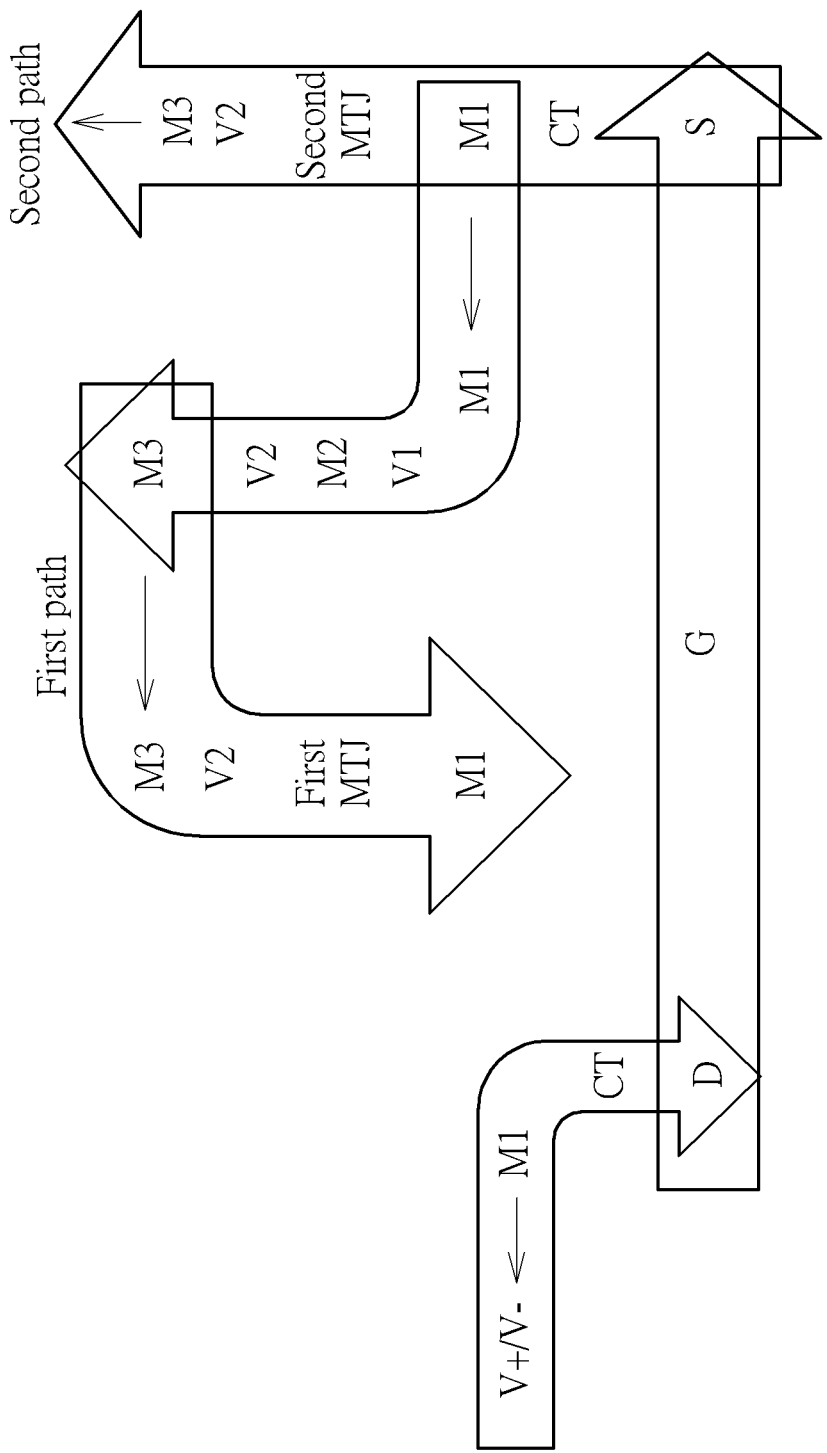
FIG. 3 illustrates a structural view of a circuit selector of embedded MRAM fabricated through metal wirings according to an embodiment of the present invention.

Referring to FIG. 3, FIG. 3 illustrates a structural view of a circuit selector of embedded MRAM fabricated through metal wirings according to an embodiment of the present invention. As shown in FIG. 3, the transistor of the circuit selector preferably includes a source terminal S (such as the aforementioned source/drain terminal 18), a gate terminal G (such as the aforementioned gate terminal 20), and a drain terminal D (such as the aforementioned drain/source terminal 22), in which the drain terminal D is coupled to a voltage source V+ or voltage source V− through a contact plug CT and a first level metal interconnection M1 while the source terminal S is coupled to two paths including a first path and a second path at the same time.

Preferably the first path of the circuit selector begins from the source terminal S upward through the contact plug CT to a first level metal interconnection M1 directly above the source terminal S, from the first level metal interconnection M1 to an adjacent first level metal interconnection M1 on the left, from the first level metal interconnection M1 on the left through the first level via conductor V1 to a second level metal interconnection M2, from the second level metal interconnection M2 through second level via conductor V2 to a third level metal interconnection M3, from the third level metal interconnection M3 to another third level metal interconnection M3 on the left, from the third level metal interconnection M3 on the left down to a first MTJ (such as the first MTJ 14) through another second level via conductor V2, and then final connects to another first level metal interconnection M1. The second path on the other hand begins from the source terminal S upward to the first level metal interconnection M1 directly above the source terminal S through contact plug CT, from the first level metal interconnection M1 directly upward to a second MTJ (such as the second MTJ 16), and then from the second MTJ through a second level via conductor V2 to a third level metal interconnection M3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit selector of embedded magnetoresistive random access memory (EMRAM), comprising:
   a transistor comprising:
      a source/drain terminal coupled to a first magnetic tunneling junction (MTJ) and a second MTJ, wherein the first MTJ comprises:
         a first free layer;
         a first barrier layer; and
         a first pinned layer;
      a first circuit, wherein one end of the first circuit is coupled to the first pinned layer and another end of the first circuit is coupled to ground;
      a gate terminal; and
      a drain/source terminal coupled to a voltage source.

2. The circuit selector of EMRAM of claim 1, wherein the first free layer is coupled to the source/drain terminal.

3. The circuit selector of EMRAM of claim 1, wherein the second MTJ comprises:
   a second free layer;
   a second barrier layer; and
   a second pinned layer.

4. The circuit selector of EMRAM of claim 3, wherein the second pinned layer is coupled to the source/drain terminal.

5. The circuit selector of EMRAM of claim 3, wherein the second free layer is coupled to a second circuit.

* * * * *